US 9,063,305 B2

(12) United States Patent
McColloch et al.

(10) Patent No.: US 9,063,305 B2
(45) Date of Patent: Jun. 23, 2015

(54) METHODS AND SYSTEMS FOR DISSIPATING HEAT IN OPTICAL COMMUNICATIONS MODULES

(71) Applicant: Avago Technologies General IP (Singapore) Pte. Ltd., Singapore (SG)

(72) Inventors: Laurence R. McColloch, Santa Clara, CA (US); David J. K. Meadowcroft, San Jose, CA (US); Seng-Kum Chan, Santa Clara, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 366 days.

(21) Appl. No.: 13/684,802

(22) Filed: Nov. 26, 2012

(65) Prior Publication Data

US 2014/0147127 A1    May 29, 2014

(51) Int. Cl.
*G02B 6/42* (2006.01)
*H05K 7/20* (2006.01)
*H01S 5/024* (2006.01)
*H04B 10/40* (2013.01)
*H01S 5/022* (2006.01)
*H01S 5/42* (2006.01)

(52) U.S. Cl.
CPC .......... *G02B 6/4269* (2013.01); *H05K 7/20436* (2013.01); *H04B 10/40* (2013.01); *H05K 7/20409* (2013.01); *H01S 5/02208* (2013.01); *H01S 5/02248* (2013.01); *H01S 5/02469* (2013.01); *H01S 5/423* (2013.01)

(58) Field of Classification Search
CPC .................................................. G02B 6/4269
See application file for complete search history.

(56) References Cited

U.S. PATENT DOCUMENTS

| 3,091,736 | A | 5/1963 | Germain |
| 7,210,862 | B2 | 5/2007 | Yoshikawa et al. |
| 7,416,353 | B2 | 8/2008 | Yoshikawa et al. |
| 7,445,968 | B2 | 11/2008 | Harrison et al. |
| 8,035,973 | B2 * | 10/2011 | McColloch .................... 361/709 |
| 8,223,498 | B2 | 7/2012 | Lima |
| 2005/0195565 | A1 * | 9/2005 | Bright ........................... 361/688 |
| 2007/0009213 | A1 * | 1/2007 | Meadowcroft et al. ......... 385/92 |
| 2009/0162051 | A1 * | 6/2009 | Hudgins et al. ................... 398/9 |
| 2011/0031385 | A1 * | 2/2011 | Ishigami et al. .............. 250/239 |
| 2012/0082420 | A1 * | 4/2012 | Aoki ............................... 385/88 |
| 2012/0148202 | A1 * | 6/2012 | Banal et al. ..................... 385/93 |
| 2012/0182688 | A1 * | 7/2012 | McColloch et al. .......... 361/692 |
| 2013/0077253 | A1 * | 3/2013 | Macall ........................... 361/715 |
| 2013/0210269 | A1 * | 8/2013 | Neer et al. ..................... 439/487 |
| 2014/0063743 | A1 * | 3/2014 | Chan et al. .................... 361/712 |

* cited by examiner

*Primary Examiner* — Michelle R Connelly (57) ABSTRACT

A heat dissipation solution is provided that is suitable for use in, but not limited to use in, CXP modules. The heat dissipation solution allows the performance of a CXP module to be significantly improved without having to increase the size of the heat dissipation device that is currently used with known CXP modules. The heat dissipation solution thermally decouples the heat dissipation path associated with the laser diodes from the heat dissipation path associated with other heat-generating components of the module, such as the laser diode driver IC and the receiver IC. Decoupling these heat dissipation paths allows the temperature of the laser diodes to be kept cooler as they are operated at higher speeds while allowing the temperatures of the other components to run hotter, if desired or necessary.

26 Claims, 10 Drawing Sheets

METHODS AND SYSTEMS FOR DISSIPATING HEAT IN OPTICAL COMMUNICATIONS MODULES

TECHNICAL FIELD OF THE INVENTION

The invention relates to optical communications modules. More particularly, the invention relates to heat dissipation systems and methods used in optical communications modules such as parallel optical transmitter, receiver and transceiver modules.

BACKGROUND OF THE INVENTION

A variety of parallel optical communications modules exist for simultaneously transmitting and/or receiving multiple optical data signals over multiple respective optical data channels. Parallel optical transmitters have multiple optical transmit channels for transmitting multiple respective optical data signals simultaneously over multiple respective optical waveguides (e.g., optical fibers). Parallel optical receivers have multiple optical receive channels for receiving multiple respective optical data signals simultaneously over multiple respective optical waveguides. Parallel optical transceivers have multiple optical transmit and receive channels for transmitting and receiving multiple respective optical transmit and receive data signals simultaneously over multiple respective transmit and receive optical waveguides.

For each of these different types of parallel optical communications modules, a variety of designs and configurations exist. A typical layout for a parallel optical communications module includes a circuit board, such as a printed circuit board (PCB), a ball grid array (BGA), or the like, on which various electrical components and optoelectronic components (i.e., laser diodes and/or photodiodes) are mounted. In the case of a parallel optical transmitter, laser diodes and one or more laser diode driver integrated circuits (ICs) are mounted on the circuit board. The circuit board has electrical conductors running through it (i.e., electrical traces and vias) and electrical contact pads on it. The electrical contact pads of the laser diode driver IC(s) are electrically connected to the electrical conductors of the circuit board. One or more other electrical components, such as a controller IC, for example, are typically also mounted on and electrically connected to the circuit board.

Similar configurations are used for parallel optical receivers, except that the circuit board of the parallel optical receiver has a plurality of photodiodes instead of laser diodes mounted on it and a receiver IC instead of a laser diode driver IC mounted on it. The receiver IC typically includes amplification circuitry and sometimes includes clock and data recovery (CDR) circuitry for recovering the clock and the data bits. Parallel optical transceivers typically have laser diodes, photodiodes, one or more laser diode driver ICs, and a receiver IC mounted on it, although one or more of these devices may be integrated into the same IC to reduce part count and to provide other benefits.

Figure 1:
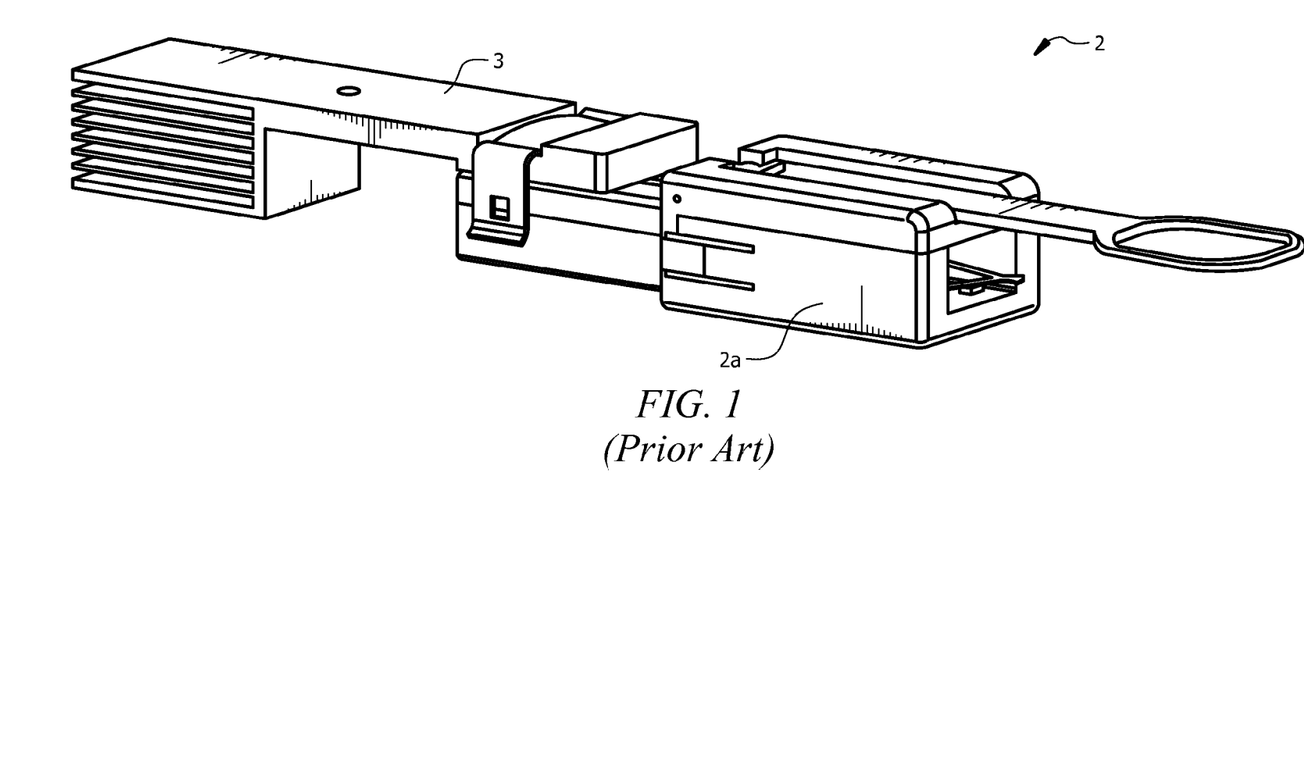
FIG. 1 illustrates a perspective view of a known parallel optical communications module commonly referred to as a CXP module, and a heat dissipation device secured to the module housing.

FIG. 1 illustrates a perspective view of a parallel optical communications module 2 known as a CXP module. The CXP module 2 is a pluggable module that typically has twelve transmit channels and twelve receive channels. The CXP module 2 is relatively compact in size and is configured to be plugged into a receptacle disposed in a front panel of a 1U box (not shown). Typically, multiple CXP modules of the type shown in FIG. 1 are plugged into respective side-by-side receptacles of a 1U box. The heat that is generated by the electrical and optoelectronic components, such as the ICs and laser diodes, for example, is transferred through the metal module housing 2a into an external heat dissipation device 3, which dissipates the heat.

The size of a heat dissipation device is directly proportional to the heat rise and its heat load. It can be seen from FIG. 1 that the size of the external heat dissipation device 3 is large compared to the size of the CXP module 2. For this reason, the heat dissipation device 3 consumes a relatively large amount of space inside of the 1U box. Specifications for the CXP module 2 set an upper limit on the temperature of the module housing 2a at 80° Celsius (C) and an upper limit on the temperature of the air inside of the 1U box at 70° C. The heat dissipation device 3 is designed to dissipate heat in a manner that allows these limits to be met.

The laser diodes of the CXP module 2 are very sensitive to increases in temperature. Generally, in order to increase the speed of the laser diodes without sacrificing performance, the operating temperature of the laser diodes needs to be lowered. One solution that would allow for a significant increase in the data rate of the laser diodes of the module 2 without degrading their performance would be to significantly increase the size of the heat dissipation device 3. However, because the heat dissipation device 3 is already relatively large, further increasing its size is not a desirable solution for a variety of reasons. For example, increasing the size of the heat dissipation device 3 could decrease module mounting density and increase costs.

Accordingly, a need exists for methods and systems that provide improved heat dissipation solutions and that are efficient in terms of space utilization.

SUMMARY OF THE INVENTION

The invention is directed to methods and systems for use in optical communications modules for dissipating heat. An optical communications module that incorporates a heat dissipation system and method comprises a module housing, at least a first electrical subassembly (ESA), at least a first heat dissipation interface, at least a first heat dissipation device, and at least a second heat dissipation device. The module housing comprises a front housing portion and a rear housing portion such that if the optical communications module is plugged into a receptacle formed in a front panel, the front housing portion is disposed in front of the front panel and the rear housing portion is disposed to the rear of the front panel. The ESA includes at least a first circuit board, at least a first IC mounted on the first circuit board, and at least a first array of laser diodes mounted on the first circuit board. The heat dissipation interface is mechanically coupled to the rear housing portion and to at least the first IC. The first heat dissipation device is mechanically coupled to the rear housing portion and thermally coupled to the heat dissipation interface. At least a portion of heat generated by the first IC is thermally coupled into the first heat dissipation device via the thermal coupling between the first heat dissipation device and the heat dissipation interface. The second heat dissipation device is mechanically coupled to the front housing portion and thermally coupled to at least the first array of laser diodes. A portion of heat generated by the laser diodes is thermally coupled into the second heat dissipation device via the thermal coupling between the second heat dissipation device and the first array of laser diodes.

The method comprises:

providing an optical communications module comprising a module housing having at least a first ESA disposed in the module housing, at least a first heat dissipation device mechanically coupled to a rear housing portion of the module housing and thermally coupled to a heat dissipation interface disposed on the rear housing portion, and at least a second heat dissipation device mechanically coupled to a front housing portion of the module housing;

dissipating at least a portion of heat generated by at least a first IC of the first ESA with the first heat dissipation device via the thermal coupling between the first heat dissipation device and the heat dissipation interface; and dissipating at least a portion of heat generated by the laser diodes with the second heat dissipation device via a thermal coupling between the second heat dissipation device and the first array of laser diodes.

These and other features and advantages of the invention will become apparent from the following description, drawings and claims.

DETAILED DESCRIPTION OF AN ILLUSTRATIVE EMBODIMENT

In accordance with the invention, a heat dissipation solution is provided that is suitable for use in, but not limited to use in, CXP modules of the type shown in FIG. 1. The heat dissipation solution allows the performance of a CXP module to be significantly improved without having to increase the size of the heat dissipation device 3, and could allow the size of the heat dissipation device 3 to be decreased. The heat dissipation solution thermally decouples the heat dissipation path associated with the laser diodes from the heat dissipation path associated with other heat-generating components of the module, such as the laser diode driver IC and the receiver IC. Decoupling these heat dissipation paths allows the temperature of the laser diodes to be kept cooler as they are operated at higher speeds while allowing the temperatures of the other components to run hotter, if desired or necessary.

In accordance with embodiments described herein, the heat dissipation device 3 inside of the 1U box only dissipates heat associated with the ICs and other electrical components of the module. The heat dissipation device 3 is not used to dissipate heat produced by the laser diodes. A separate heat dissipation device that is outside of the 1U box is used to dissipate the heat that is produced by the laser diodes. The two heat dissipation devices are thermally decoupled from one another. Illustrative, or exemplary, embodiments of the heat dissipation solution of the invention will be described below with reference to the figures.

One of the goals of the invention is to provide a CXP module that has very high performance without having to increase the size of the heat dissipation device 3. The high-performance CXP module of the illustrative embodiment utilizes vertical cavity surface emitting laser diodes (VCSELs) that operate at high speed (e.g., 20 to 25 Gigabits per second (Gbps)), although the invention is not limited with respect to the types of laser diodes that are used in the module or with respect to the speed of the laser diodes. While the thermal power produced by the VCSELs is only a small portion of the total thermal load and is relatively constant, the thermal power produced by the ICs increases greatly as the bit rate increases. For example, for high-speed data that is received in the high-performance CXP module, one or more of the ICs will typically include CDR circuitry that is utilized to recover the clock and the data bits. CDR circuitry generally consumes and dissipates a relatively large amount of power. In contrast to the known CXP module 2 shown in FIG. 1, which dissipates about 2 to 3 Watts of power for the VCSELs and the ICs combined, the high-performance CXP module of the illustrative embodiment typically dissipates about 4 to 9 Watts of power for the VCSELs and the ICs combined. Of the 4 to 9 Watts of total power dissipated, the VCSELs are only responsible for about 10% (i.e., 0.4 to 0.9 Watts).

Therefore, assuming that the heat dissipation device 3 shown in FIG. 1 is used in the high-performance CXP module of the illustrative embodiment, the heat dissipation device 3 should be capable of dissipating anywhere from about 3.6 to about 8.1 Watts. As also indicated above, existing CXP standards set the maximum temperature of the CXP module housing 2a at 80° C. and the maximum temperature of the surrounding air inside of the U1 box at 70° C., which corresponds to a temperature differential of 10° C. However, the ICs are capable of operating satisfactorily at a temperature as high as about 125° C. Because the ICs are capable of operating satisfactorily at a higher operating temperature, in accordance with one illustrative embodiment, the temperature of the CXP module housing 2a is allowed to increase to 90° C., which corresponds to a temperature differential between the temperature of the air inside of the box (70° C.) and the temperature of the module housing 2a of 20° C. Thus, the temperature differential has now doubled from 10° C. to 20° C. The doubling of this temperature differential means that the heat dissipation device 3 can now absorb twice as much heat without having to be increased in size.

On the other hand, VCSELs capable of operating at the higher speed often only can do so at lower temperatures. In the known CXP module 2 shown in FIG. 1, the laser diodes operated at lower speeds and therefore were allowed to operate at a temperature of approximately 90° C. However, in order to operate the VCSELs of the high-performance CXP module at higher data rates (e.g., 20 to 25 Gbps) without suffering a degradation in performance, it has been determined that they should be maintained at a temperature of about 70° C. CXP standards limit the maximum temperature of the ambient air in front of the 1U box to 55° C. In accordance with the illustrative embodiment, the heat dissipation device that is used for dissipating heat produced by the VCSELs is disposed on the portion of the module housing that is located on the front side of the box so that it is cooled by the ambient air in front of the box. This heat dissipation device is designed to ensure that it adequately dissipates the heat produced by the VCSELs so that their operating temperatures do not exceed about 70° C. An illustrative embodiment of the configuration of this heat dissipation device and the manner in which the heat dissipation paths of the ICs and the VCSELs are thermally decoupled will now be described with reference to FIGS. 2-9, in which like reference numerals represent like components, elements or features.

Figure 2:
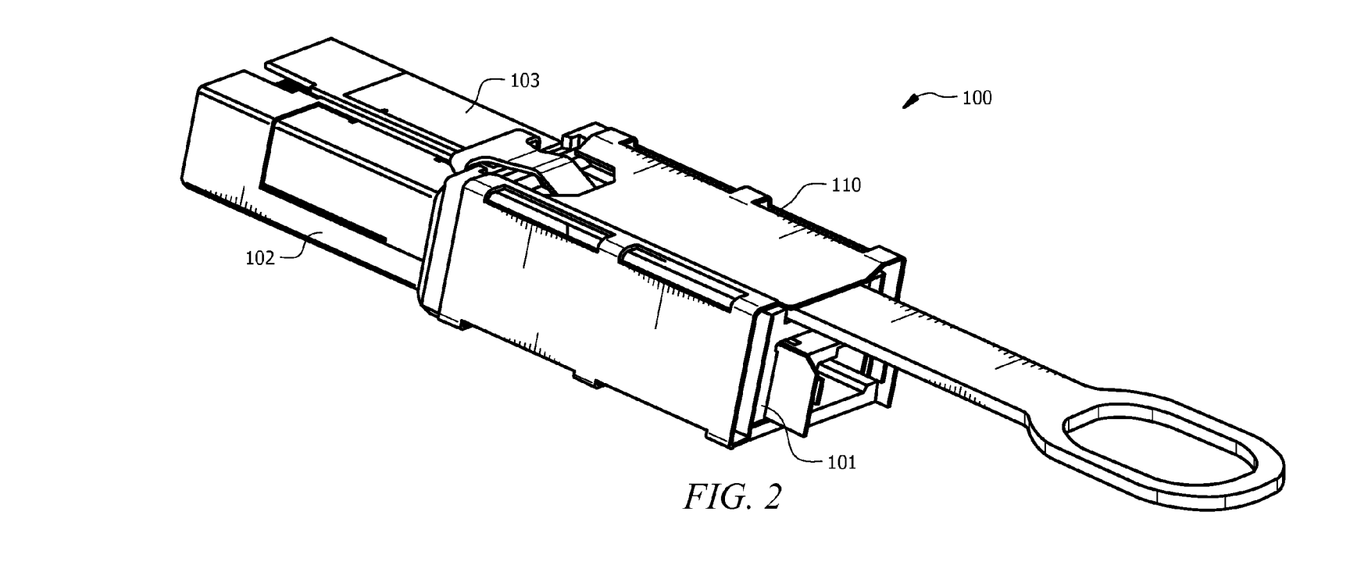
FIG. 2 illustrates a perspective view of a high-performance CXP module in accordance with an illustrative embodiment having front and rear housing portions, a heat dissipation interface disposed on the rear housing portion, and a heat dissipation device disposed in the front housing portion.
Figure 3:
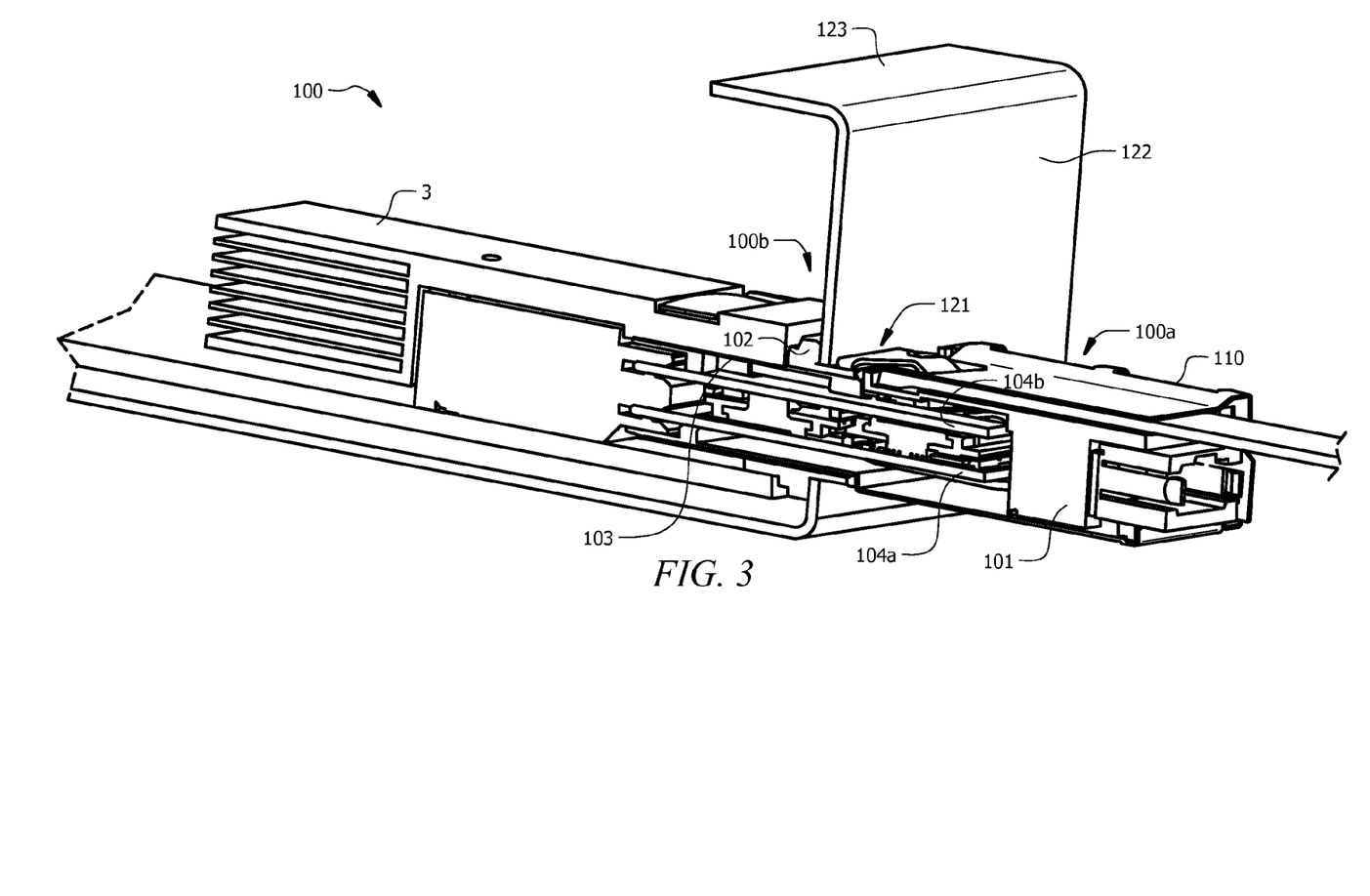
FIG. 3 illustrates a cross-sectional perspective view of the CXP module shown in FIG. 2 plugged into a receptacle formed in a front panel of a 1U box.

FIG. 2 illustrates a perspective view of the high-performance CXP module 100 in accordance with an illustrative embodiment having front and rear housing portions 101 and 102, respectively, a heat dissipation interface 103 disposed on the rear housing portion 102, and a heat dissipation device 110 disposed in the front housing portion 101. FIG. 3 illustrates a cross-sectional perspective view of the CXP module 100 shown in FIG. 2 plugged into a receptacle 121 formed in a front panel 122 of a 1U box 123, of which only a portion is shown in FIG. 3 for purposes of clarity. In the cross-sectional view of FIG. 3, portions of first and second circuit boards 104a and 104b, respectively, and portions of the heat dissipation interface 103 and heat dissipation device 110 of the module 100 can be seen.

Figure 4:
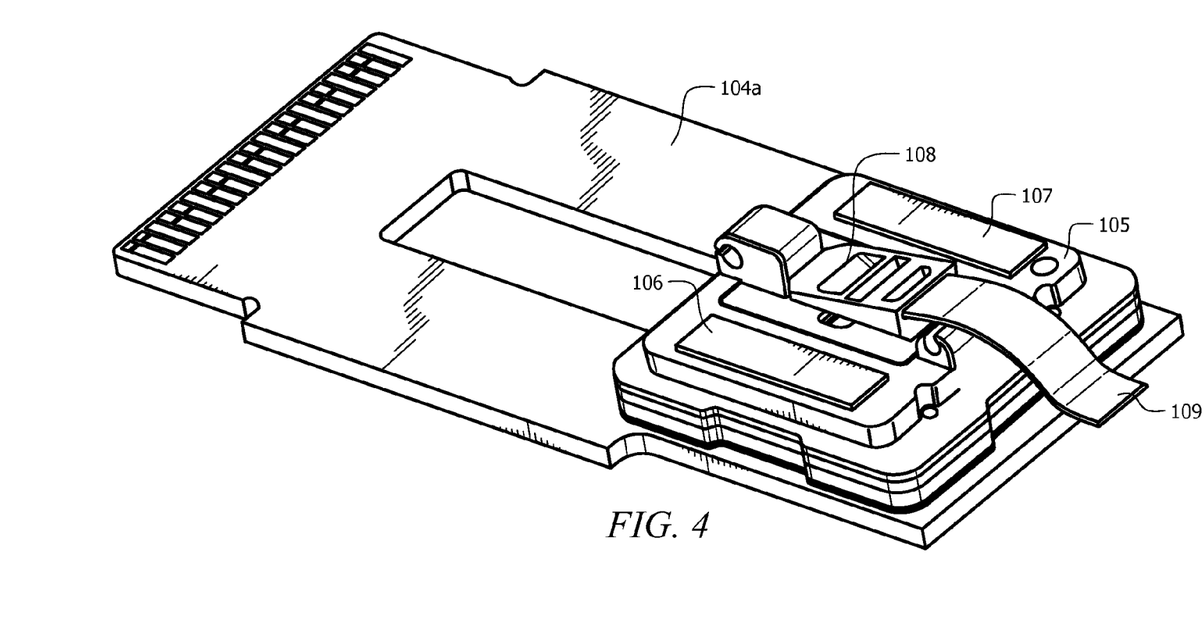
FIG. 4 illustrates a top perspective view of a portion of the CXP module shown in FIG. 2 with the CXP module housing removed to reveal internal features of the CXP module, including a first circuit board, a plastic cover, first and second heat dissipation blocks mounted on the first circuit board and protruding through respective openings formed in the plastic cover, and an optical connector mated with a receptacle formed in the plastic cover.
Figure 5:
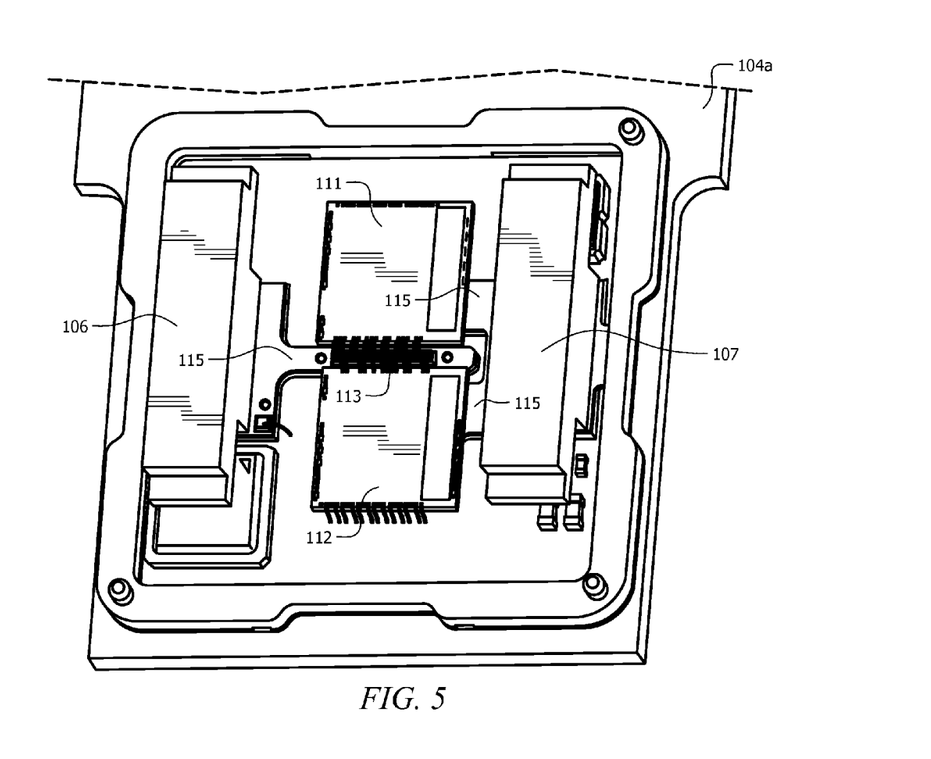
FIG. 5 illustrates a top perspective view of a portion of the CXP module shown in FIG. 4 with the plastic cover and the optical connector removed to reveal other components of the CXP module, including portions of the first circuit board, the first and second heat dissipation blocks, first and second ICs, and an array of VCSELs.

FIG. 4 illustrates a top perspective view of a portion of the CXP module 100 shown in FIG. 2 with the CXP module housing 101/102 removed to reveal internal features of the CXP module 100, including the first circuit board 104a, a plastic cover 105, first and second heat dissipation blocks 106 and 107, respectively, mounted on the first circuit board 104a and protruding through respective openings formed in the plastic cover 105, and an optical connector 108 mated with a receptacle formed in the plastic cover 105. FIG. 5 illustrates a top perspective view of a portion of the CXP module 100 shown in FIG. 4 with the plastic cover 105 and the optical connector 108 removed to reveal other components of the CXP module 100, including portions of the first circuit board 104a, the first and second heat dissipation blocks 106 and 107, first and second ICs 111 and 112, respectively, and an array of VCSELs 113. The plastic cover 105 (FIG. 4) has an optics system (not shown) formed therein for optically coupling optical signals passing out of the ends of optical fibers 109 (FIG. 4) held in the optical connector 108 (FIG. 4) onto respective VCSELs of the VCSEL array 113.

Figure 6:
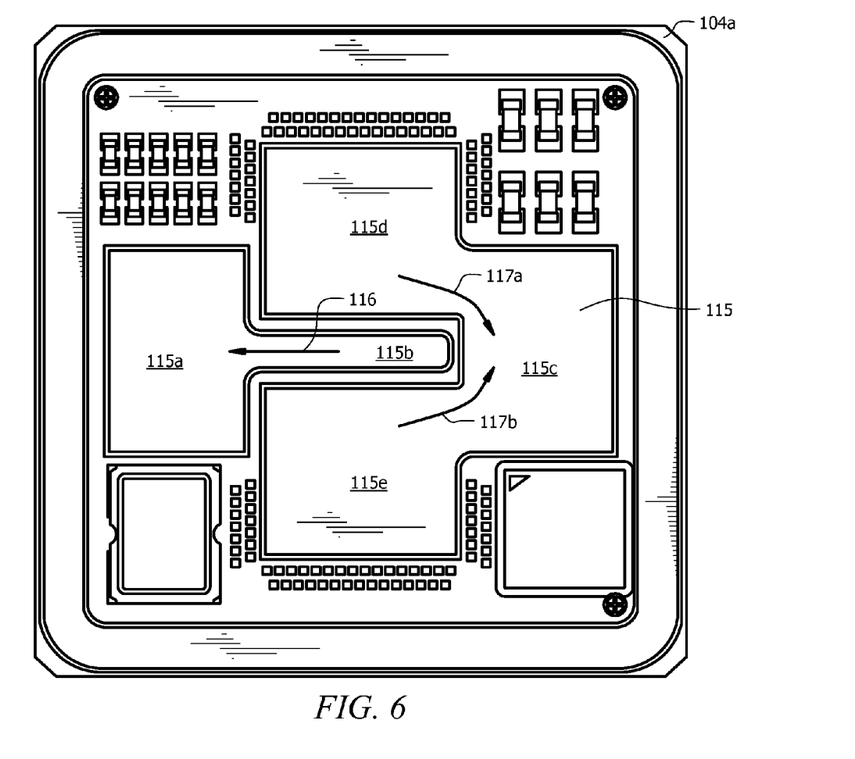
FIG. 6 illustrates a top plan view of the portion of the first circuit board shown in FIG. 5 with the ICs and the VCSEL array removed to reveal a patterned heat dissipation layer formed on the upper surface of the first circuit board.
Figure 7:
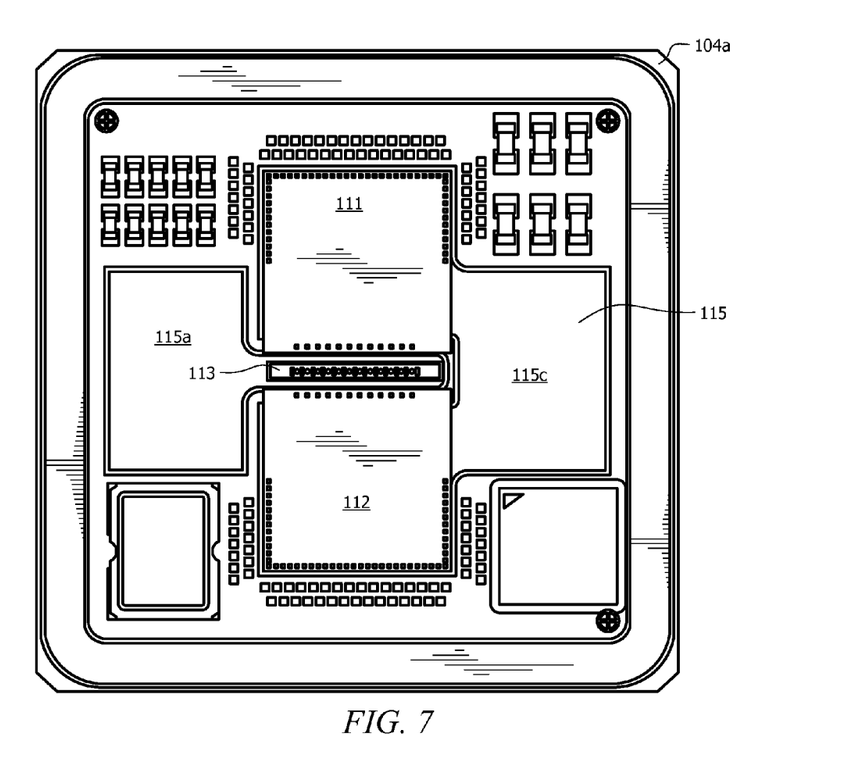
FIG. 7 illustrates a top plan view of the portion of the first circuit board shown in FIG. 6 with the ICs and the VCSEL array mounted on particular portions of the patterned heat dissipation layer.

FIG. 6 illustrates a top plan view of the portion of the first circuit board 104a shown in FIG. 5 with the ICs 111 and 112 and the VCSEL array 113 removed to reveal a patterned thermally-conductive heat dissipation layer 115 formed on the upper surface of the first circuit board 104a. FIG. 7 illustrates a top plan view of the portion of the first circuit board 104a shown in FIG. 6 with the ICs 111 and 112 and the VCSEL array 113 mounted on particular portions of the patterned heat dissipation layer 115.

Figure 8A:
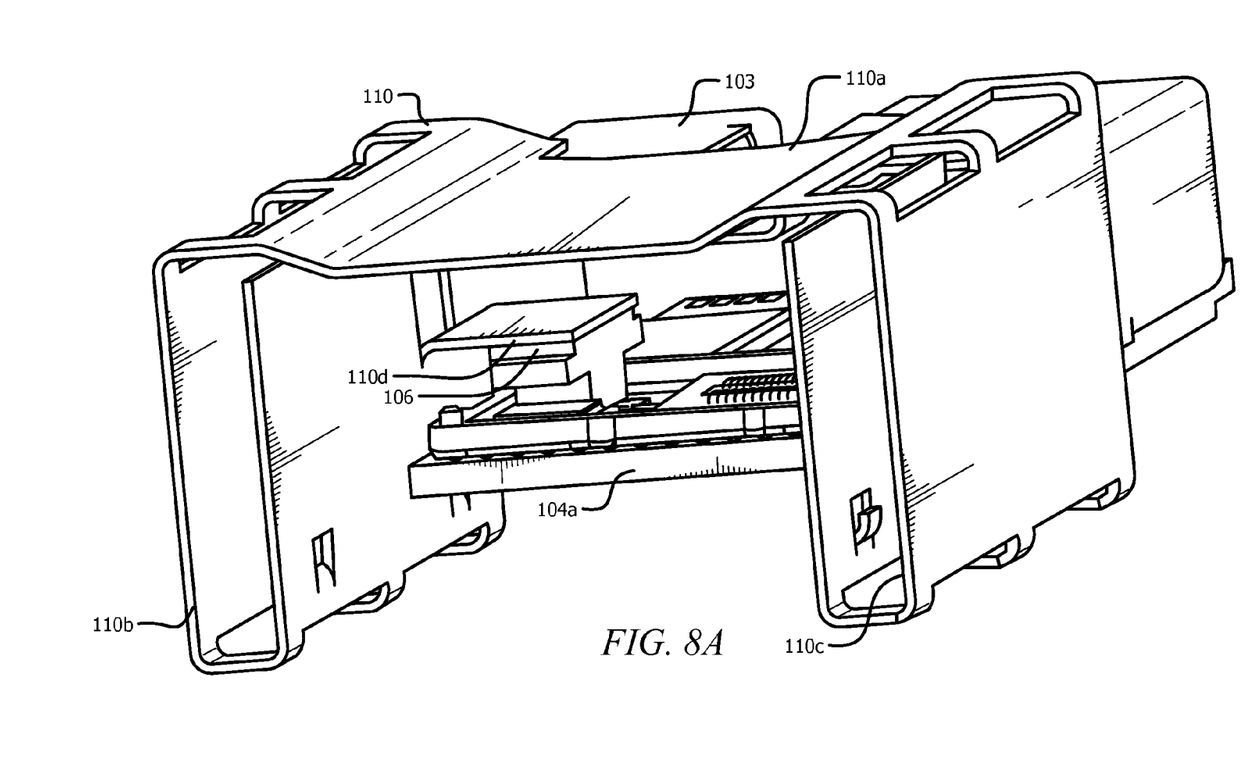
FIGS. 8A and 8B illustrate front and rear perspective views, respectively, of the heat dissipation interface and the heat dissipation device of the CXP module shown in FIGS. 2 and 3.
Figure 8B:
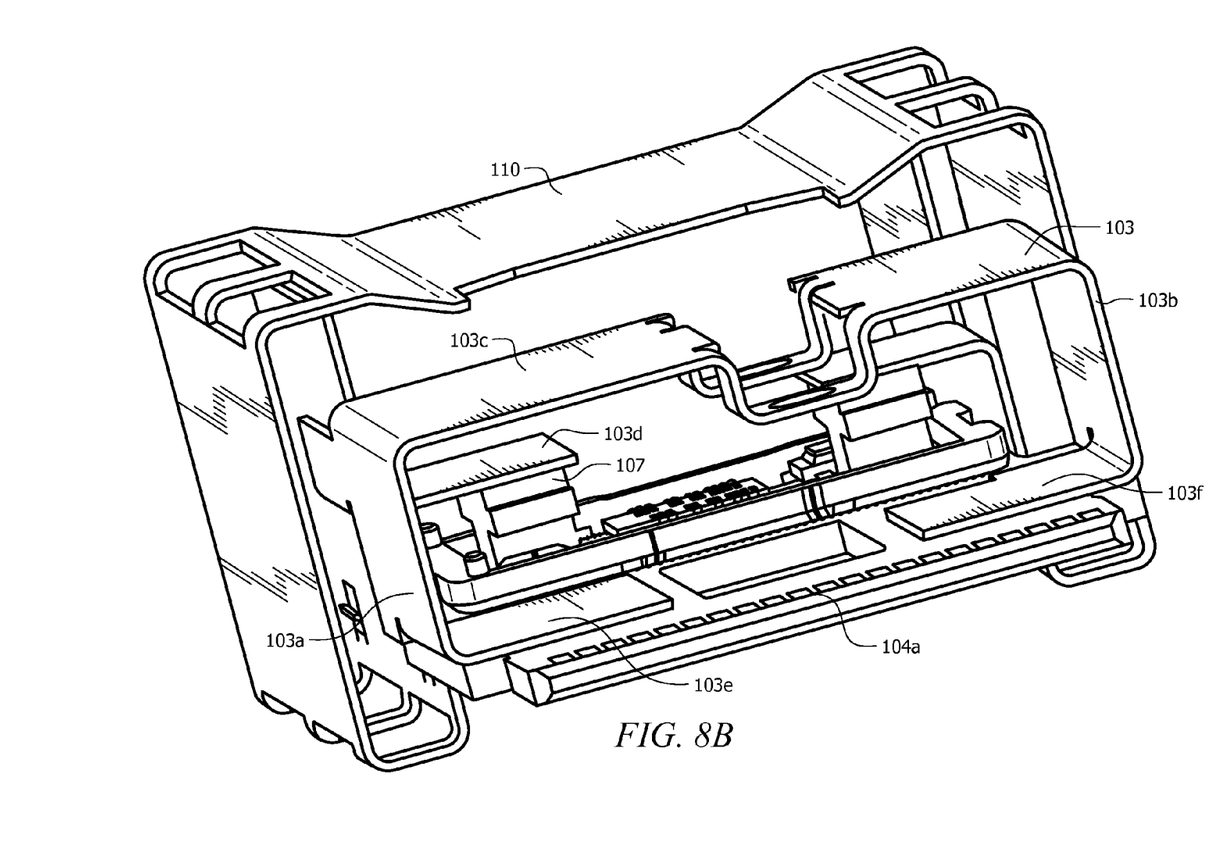
Figure 9:
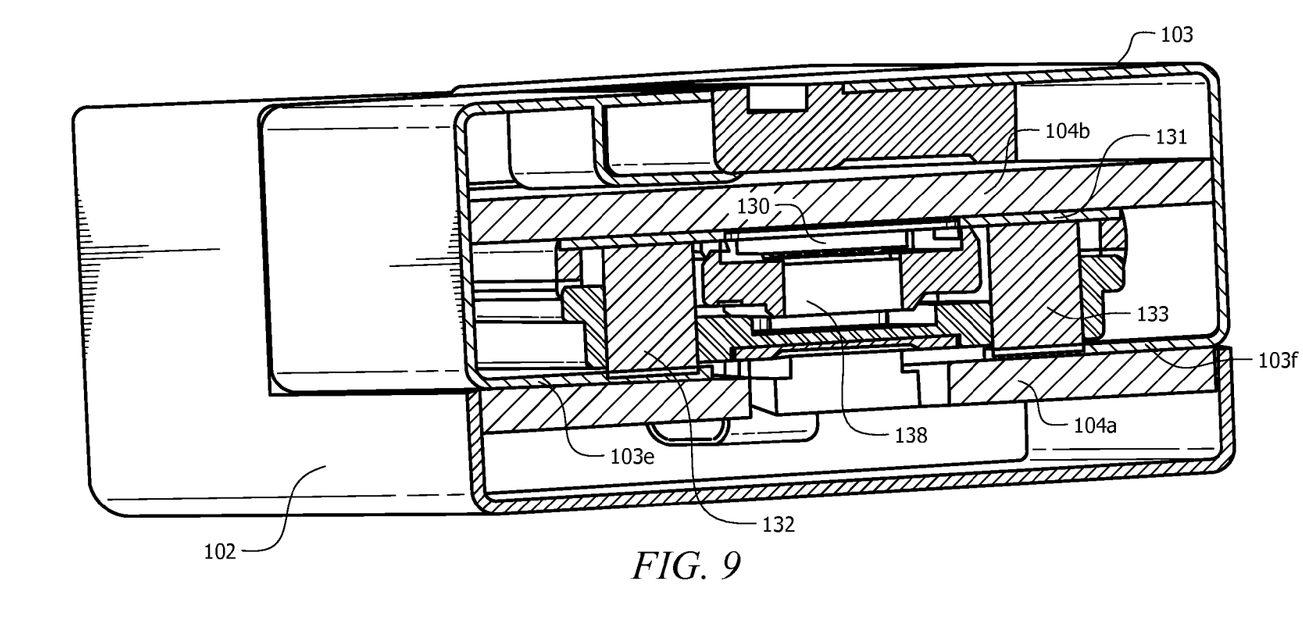
FIG. 9 illustrates a rear perspective view of the rear housing portion that shows the configuration of the heat dissipation interface and the thermal path that it provides.

FIGS. 8A and 8B illustrate front and rear perspective views, respectively, of the heat dissipation interface 103 and the heat dissipation device 110 of the CXP module 100 shown in FIGS. 2 and 3. FIG. 9 illustrates a rear perspective view of the rear housing portion 102 that shows the configuration of the heat dissipation interface 103 and the thermal path that it provides. The high-performance CXP module 100 and the improved heat dissipation solution employed therein will now be described with reference to FIGS. 2-9.

With reference first to FIG. 3, the CXP module 100 has a front module portion 100a and a rear module portion 100b that are disposed in front of and to the rear of, respectively, the front panel 122 of the 1U box 123 when the CXP module 100 is plugged into the receptacle 121 formed in the front panel 122. The front module portion 100a includes the front housing portion 101 and components of the CXP module 100 that are housed in the front housing portion 101, including front portions of first and second circuit boards 104a and 104b on which various components (not shown for purposes of clarity) are mounted. The rear module portion 100b includes the rear housing portion 102 and components of the CXP module 100 that are housed in the rear housing portion 102, including rear portions of the first and second circuit boards 104a and 104b and various components mounted thereon. The front and rear housing portions 101 and 102 are typically integrally formed in a single housing, but they could be separate parts that are mechanically coupled to one another. In accordance with this illustrative embodiment, the front and rear housing portions 101 and 102 are made of a thermally-insulating material, such as plastic, for example.

The heat dissipation interface 103 is disposed on and in the rear housing portion 102 (FIG. 2). The heat dissipation interface 103 is made of a material of high thermal conductivity, such as copper, for example, and is mechanically and thermally coupled with the heat dissipation device 3 (FIG. 3). As will be described below in more detail, heat generated by the ICs (FIG. 5) of the module 100, but not by the VCSEL array 113 (FIG. 5), is transferred via interface 103 to the heat dissipation device 3 where the heat is dissipated.

The heat dissipation device 110 is secured to the front housing portion 101 (FIGS. 2 and 3) in a fixed, predetermined position. As shown in FIG. 3, the heat dissipation device 110 is disposed on the front side of the front panel 122 when the CXP module 100 is plugged into the receptacle 121. As will be described below in more detail, heat generated by the VCSELs of the array 113 (FIG. 5) is transferred to the heat dissipation device 110, which is cooled by the air that surrounds the heat dissipation device 110 on the front side of the panel 122. The thermal paths along which heat is transferred to the heat dissipation devices 3 and 110 are thermally decoupled from one another, as will be described below in more detail.

With reference to FIG. 6, which shows the patterned heat dissipation layer 115 with the ICs 111, 112 and the VCSELs 113 removed, a portion 115a of the patterned heat dissipation layer 115 is used for dissipating heat generated by the array of VCSELs 113 (FIGS. 5 and 7). The heat dissipation layer 115 is made of a material of high thermal conductivity, such as copper, for example. The portion 115b (FIG. 6) of the heat dissipation layer 115 acts as a heat dissipation pad for placement of the array of VCSELs 113 (FIGS. 5 and 7) on the circuit board 104. Heat generated by the VCSEL array 113 is first transferred downwards into portion 115b (FIG. 6) of the heat dissipation layer 115 and then travels along a thermal path represented by arrow 116 (FIG. 6) into portion 115a (FIGS. 6 and 7) of the heat dissipation layer 115. The heat dissipation block 106 (FIG. 5) is mounted on portion 115a such that heat that flows into portion 115a then flows into heat dissipation block 106, which is made of a material of high thermal conductivity such as copper, for example. The heat that flows into heat dissipation block 106 is ultimately transferred into heat dissipation device 110 (FIGS. 2 and 3) by a thermal path that will be described below in detail.

The portion 115c (FIGS. 6 and 7) of the heat dissipation layer 115 is used for dissipating heat generated by the ICs 111 and 112. In accordance with this illustrative embodiment, the ICs 111 and 112 (FIGS. 5 and 7) include VCSEL driver circuitry for driving the VCSELs of the array 113 and CDR circuitry for performing clock and data recovery on signals received in the receive channels of the CXP module 100. The portions 115d and 115e (FIG. 6) of the heat dissipation layer 115 act as heat dissipation pads for placement of the ICs 111 and 112 (FIGS. 5 and 7) on the first circuit board 104a. Heat generated by the ICs 111 and 112 is first transferred downwards into portions 115d and 115e (FIG. 6) of the heat dissipation layer 115 and then travels along thermal paths represented by arrows 117a and 117b (FIG. 6), respectively, into portion 115c of the heat dissipation layer 115. The heat dissipation block 107 (FIG. 5) is mounted on portion 115c such that heat that flows into portion 115c then flows into heat dissipation block 107, which is made of a material of high thermal conductivity such as copper, for example. The heat that flows into heat dissipation block 107 is transferred into heat dissipation interface 103 (FIGS. 2 and 3) by a thermal path that will be described below in detail. The heat that is transferred into heat dissipation interface 103 is ultimately transferred via interface 103 into heat dissipation device 3 (FIG. 3).

With reference to FIG. 8A, the relationship between the first circuit board 104a, the components mounted thereon, and the heat dissipation device 110 can be clearly seen. For purposes of clarity, the first and second module housing portions 101 and 102 and the second circuit board 104b are not shown to allow the thermal path from the heat dissipation block 106 to the heat dissipation device 110 to be clearly seen. The heat dissipation device 110 is made of a thermally-conductive material. In accordance with this illustrative embodiment, the heat dissipation device 110 is generally U-shaped, as defined by a horizontal portion 110a and vertical side portions 110b and 110c, which are interconnected by the horizontal portion 110a. In accordance with this illustrative embodiment, each of the side portions 110b and 110c is folded into a U-shaped side portion to increase the amount of surface area over which heat is transferred. A tab 110d is in direct contact with the heat dissipation block 106 to provide the thermal path for heat to flow from the heat dissipation block 106 into the heat dissipation device 110.

Because the heat dissipation device 110 is disposed on the front side of front panel 122 of the 1U box 123 (FIG. 3), the surrounding air is typically about 55° C. The heat dissipation device 110 adequately dissipates the heat produced by the array of VCSELs 113 (FIG. 5) so that their operating temperatures do not exceed about 70° C. This allows the VCSELs of the array 113 to be operated at higher speeds (e.g., 20 to 25 Gbps). However, because the heat dissipation device 110 is disposed on the front side of the panel 122, it may be accessible by human beings. Therefore, it is undesirable to allow the heat dissipation device 110 to become so hot that it presents a burn hazard to human beings. For this reason, in accordance with the preferred embodiment, the heat dissipation device 110 has a sufficiently high thermal conductivity to maintain the VCSELs of the array 113 at about 70° C., but a sufficiently low thermal conductivity that the heat dissipation device 110 does not present a burn hazard for human beings. In other words, the heat dissipation device 110 preferably is designed and manufactured to have a limited thermal conductivity that is sufficient to achieve both of these goals.

One way to accomplish both of these goals is to make the heat dissipation device 110 of stainless steel and then coat it with thermally-insulating powder paint. The finished heat dissipation device 110 is preferably, but not necessarily, black in color because black is the most efficient color in terms of heat radiation. By using stainless steel covered with thermally-insulating powder paint, instead of, for example, copper, which has a very high thermal conductivity, the heat dissipation device 110 is provided with a sufficiently high thermal conductivity to maintain the VCSEL array 113 at about 70° C., but a sufficiently low thermal conductivity to prevent it from being a burn hazard.

In order to achieve these goals, the heat dissipation device 110 should have a thermal conductivity that ranges from a minimum of about 2.0 Watts per meter-kelvin (W/m-K) to a maximum of about 50.0 W/m-K. The heat dissipation device 110 can be provided with this limited thermal conductivity in a number of ways, as will be understood by persons skilled in the art in view of the description being provided herein. For example, a variety of materials and treatments may be used for this purpose, including a variety of ceramic materials. Also, various portions of the heat dissipation device 110 may have different thermal conductivities. For example, the tab 110d and the inner portions of the U-shaped sides 110b and 110c may be made of a material that has a high thermal conductivity, such as copper, while the horizontal portion 110a and the outer portions of the U-shaped sides 110b and 110c may be made of a material that has a lower thermal conductivity so as not to present a burn hazard, such as the aforementioned stainless steel covered with thermally-insulating powder paint. This latter approach is similar to equipping a metal frying pan with a wooden handle. Persons of skill in the art will understand, in view of the description provided herein, how to configure the heat dissipation device 110 to achieve these goals.

With reference to FIG. 8B, the thermal path from the heat dissipation block 107 to the heat dissipation interface 103 can be clearly seen. It should be noted that the heat dissipation device 110 and the heat dissipation interface 103 do not come into physical contact with each other. In other words, they are mechanically and thermally isolated from one another. The heat dissipation interface 103 is made of a thermally-conductive material, and preferably a material of high thermal conductivity, such as copper, for example. Because the heat dissipation interface 103 is disposed behind the front panel 122, it is generally not accessible by human beings and therefore is not a burn hazard concern.

In accordance with this illustrative embodiment, the heat dissipation interface 103 has vertical side walls 103a and 103b, a generally horizontal portion 103c that interconnects the side walls 103a and 103b, and first, second and third tabs 103d, 103e and 103f, respectively, that are interconnected with one of the side walls 103a and 103b. The first tab 103d is in contact with the second heat dissipation block 107 to enable heat that is transferred into the second heat dissipation block 107 to then be transferred into the heat dissipation interface 103. The heat that is transferred into the heat dissipation interface 103 is subsequently transferred into the heat dissipation device 3 (FIG. 3).

In FIG. 9, the first and second circuit boards 104a and 104b and the components that are mounted on them can be seen. The first circuit board 104a and the components that are mounted on it (FIGS. 5 and 8A) comprise the electrical subassembly (ESA) of the transmitter side of the CXP module 100. The second circuit board 104b and the components that are mounted on it (FIG. 9) comprise the ESA of the receiver side of the CXP module 100. The ESA for the receiver side includes one or more receiver ICs (not shown for purposes of clarity) and an array of photodiodes 130. The receiver ICs and the photodiode array 130 are mounted on a patterned heat dissipation layer 131 in the same manner in which the ICs 111 and 112 and the VCSEL array 113 are mounted on the patterned heat dissipation layer 115 shown in FIG. 7. Third and fourth heat dissipation blocks 132 and 133, respectively, are mounted on the patterned heat dissipation layer 131 in the same manner in which the first and second heat dissipation blocks 106 and 107, respectively, are mounted on the patterned heat dissipation layer 115, as described above with reference to FIG. 7. An optical connector 138 that may be identical to the optical connector 108 (FIG. 4) is mated with a receptacle formed in a plastic cover 139 that may be identical to the plastic cover 105 (FIG. 4).

The third and fourth heat dissipation blocks 132 and 133 are in contact with the second and third tabs 103e and 103f, respectively, of the heat dissipation interface 103, as shown in FIG. 9. Heat generated by the ICs (not shown) of the receiver ESA is transferred into the third heat dissipation block 132 and then is transferred via the second tab 103e into the other portions of the heat dissipation interface 103. Heat generated by the photodiode array 130 of the receiver ESA is transferred into the fourth heat dissipation block 133 and then is transferred via the third tab 103f into the other portions of the heat dissipation interface 103. As indicated above, heat that is transferred into the heat dissipation interface 103 is subsequently transferred into the heat dissipation device 3 (FIG. 3).

It should be noted that the high-performance CXP module 100 has been described with reference to illustrative embodiments for the purposes of describing the principles and concepts of the invention. Many variations can be made to the CXP module 100 without deviating from the invention. For example, the transmitter and receiver ESAs can have a variety of configurations while still achieving the goals of the invention, as will be understood by persons of skill in the art in view of the description provided herein. Likewise, the heat dissipation interface 103 and the heat dissipation device 110 can have a variety of configurations while still achieving the goals of the invention, as will be understood by persons of skill in the art in the art in view of the description provided herein.

Also, although the invention has been described with reference to use in a CXP module, the invention is not limited to being used in a CXP module, but can be used in any type of optical communications module in which the same or similar goals to those described herein need to be achieved. As will be understood by those skilled in the art in view of the description being provided herein, many additional modifications may be made to the embodiments described herein while still achieving the goals of the invention, and all such modifications are within the scope of the invention.

What is claimed is:

1. An optical communications module comprising:
a module housing comprising a front housing portion and a rear housing portion, wherein if the optical communications module is plugged into a receptacle formed in a front panel, the front housing portion is disposed in front of the front panel and the rear housing portion is disposed to the rear of the front panel;
at least a first electrical subassembly (ESA) disposed in the module housing, the ESA including at least a first circuit board, at least a first integrated circuit (IC) mounted on the first circuit board, and at least a first array of laser diodes mounted on the first circuit board;
a heat dissipation interface mechanically coupled to the rear housing portion and to said at least a first IC;
at least a first heat dissipation device mechanically coupled to the rear housing portion and thermally coupled to the heat dissipation interface, wherein at least a portion of heat generated by said at least a first IC is thermally coupled into the first heat dissipation device via the thermal coupling between the first heat dissipation device and the heat dissipation interface; and
at least a second heat dissipation device mechanically coupled to the front housing portion and thermally coupled to said at least a first array of laser diodes, wherein at least a portion of heat generated by the laser diodes is thermally coupled into the second heat dissipation device via the thermal coupling between the second heat dissipation device and the first array of laser diodes.

2. The optical communications module of claim 1, further comprising:
at least a second ESA disposed in the module housing, the second ESA including at least a second circuit board, at least a second IC mounted on the second circuit board, and at least a first array of photodiodes mounted on the second circuit board, and wherein the heat dissipation interface is also thermally coupled to said at least a second IC and to said at least a first array of photodiodes such that at least a portion of heat generated by the second IC and the photodiodes is thermally coupled into the first heat dissipation device via the thermal coupling between the first heat dissipation device and the heat dissipation interface.

3. The optical communications module of claim 1, wherein the second heat dissipation device has a thermal conductivity that ranges from about 2.0 Watts per meter-kelvin (W/m-K) to a maximum of about 50.0 W/m-K.

4. The optical communications module of claim 3, wherein the second heat dissipation device is made of stainless steel.

5. The optical communications module of claim 4, wherein the stainless steel is coated with thermally-insulating powder paint.

6. The optical communications module of claim 3, wherein the second heat dissipation device is made of a ceramic material.

7. The optical communications module of claim 1, wherein the heat dissipation interface and the second heat dissipation device are thermally decoupled from one another.

8. The optical communications module of claim 1, wherein the module housing comprises a thermally-insulating material at least at locations where the heat dissipation interface and the second heat dissipation device are mechanically coupled to the rear and front housing portions, respectively.

9. The optical communications module of claim 8, wherein the thermally-insulating material is plastic.

10. The optical communications module of claim 8, wherein the thermally-insulating material is a ceramic.

11. The optical communications module of claim 1, wherein the optical communications module is a CXP module.

12. The optical communications module of claim 11, wherein the first array of laser diodes comprises at least twelve laser diodes, and wherein each laser diode is operated at a speed of at least 20 Gigabits per second (Gbps).

13. The optical communications module of claim 12, wherein the second heat dissipation device dissipates enough heat to maintain the laser diodes at a temperature of about 70° Celsius (C).

14. A method for dissipating heat in an optical communications module, the method comprising:

providing an optical communications module comprising a module housing having at least a first electrical subassembly (ESA) disposed in the module housing, the module housing comprising a front housing portion and a rear housing portion, the first ESA including at least a first circuit board, at least a first integrated circuit (IC) mounted on the first circuit board, and at least a first array of laser diodes mounted on the first circuit board, wherein the rear housing portion includes a heat dissipation interface that is thermally coupled to at least the first IC and to a first heat dissipation device that is mechanically coupled to the rear housing portion, and wherein the front housing portion has at least a second heat dissipation device mechanically coupled thereto that is thermally coupled to said at least a first array of laser diodes, and wherein the optical communications module is plugged into a receptacle formed in a front panel such that the front housing portion is disposed in front of the front panel and the rear housing portion is disposed to the rear of the front panel;

dissipating at least a portion of heat generated by said at least a first IC with the first heat dissipation device via the thermal coupling between the first heat dissipation device and the heat dissipation interface; and dissipating at least a portion of heat generated by the laser diodes with the second heat dissipation device via the thermal coupling between the second heat dissipation device and the first array of laser diodes.

15. The method of claim 14, wherein at least a second ESA is disposed in the module housing, the second ESA including at least a second circuit board, at least a second IC mounted on the second circuit board, and at least a first array of photodiodes mounted on the second circuit board, and wherein the heat dissipation interface is also thermally coupled to said at least a second IC and to said at least a first array of photodiodes, the method further comprising:

dissipating at least a portion of heat generated by the second IC and the photodiodes with the first heat dissipation device via the thermal coupling between the first heat dissipation device and the heat dissipation interface.

16. The method of claim 14, wherein the second heat dissipation device has a thermal conductivity that ranges from about 2.0 Watts per meter-kelvin (W/m-K) to a maximum of about 50.0 W/m-K.

17. The method of claim 16, wherein the second heat dissipation device is made of stainless steel.

18. The method of claim 17, wherein the stainless steel is coated with thermally-insulating powder paint.

19. The method of claim 16, wherein the second heat dissipation device is made of a ceramic material.

20. The method of claim 14, wherein the heat dissipation interface and the second heat dissipation device are thermally decoupled from one another.

21. The method of claim 14, wherein the module housing comprises a thermally-insulating material at least at locations where the heat dissipation interface and the second heat dissipation device are mechanically coupled to the rear and front housing portions, respectively.

22. The method of claim 21, wherein the thermally-insulating material is plastic.

23. The method of claim 21, wherein the thermally-insulating material is a ceramic.

24. The method of claim 14, wherein the optical communications module is a CXP module.

25. The method of claim 14, wherein the first array of laser diodes comprises at least twelve laser diodes, and wherein each laser diode is operated at a speed of at least 20 Gigabits per second (Gbps).

26. The method of claim 25, wherein the second heat dissipation device dissipates enough heat to maintain the laser diodes at a temperature of about 70° Celsius (C).

* * * * *